(12) United States Patent
Gort et al.

(10) Patent No.: US 11,791,821 B2
(45) Date of Patent: Oct. 17, 2023

(54) FAST FPGA INTERCONNECT STITCHING FOR WIRE HIGHWAYS

(71) Applicant: EFINIX, INC., Santa Clara, CA (US)

(72) Inventors: Marcel Gort, Toronto (CA); Tony Ngai, Toronto (CA); Brett Grady, Toronto (CA); Kara Poon, Toronto (CA)

(73) Assignee: EFINIX INC., Santa Clara, CA (US)

( * ) Notice: Subject to any disclaimer, the term of this patent is extended or adjusted under 35 U.S.C. 154(b) by 105 days.

(21) Appl. No.: 17/588,715

(22) Filed: Jan. 31, 2022

(65) Prior Publication Data

US 2022/0247412 A1 Aug. 4, 2022

Related U.S. Application Data

(60) Provisional application No. 63/144,882, filed on Feb. 2, 2021.

(51) Int. Cl.
*H03K 19/177* (2020.01)
*H03K 19/173* (2006.01)

(52) U.S. Cl.
CPC ....... *H03K 19/1737* (2013.01); *H03K 19/177* (2013.01); *H03K 19/1735* (2013.01)

(58) Field of Classification Search
CPC .......... H03K 19/1735; H03K 19/1737; H03K 19/177
See application file for complete search history.

(56) References Cited

U.S. PATENT DOCUMENTS

| | | | | |
|---|---|---|---|---|
| 5,369,314 A | * | 11/1994 | Patel | H03K 19/1737 714/E11.111 |
| 5,434,514 A | * | 7/1995 | Cliff | H03K 19/00392 326/38 |
| 5,592,102 A | * | 1/1997 | Lane | G06F 15/7867 326/38 |
| 6,167,558 A | * | 12/2000 | Trimberger | G01R 31/318519 716/128 |
| 9,118,325 B1 | * | 8/2015 | Patil | H03K 19/17736 |
| 2014/0097869 A1 | * | 4/2014 | Ngai | G06F 30/34 326/41 |
| 2017/0099052 A1 | * | 4/2017 | Chakrabarti | H03K 19/17728 |

* cited by examiner

*Primary Examiner* — Kurtis R Bahr
(74) *Attorney, Agent, or Firm* — Womble Bond Dickinson (US) LLP

(57) ABSTRACT

A field programmable gate array (FPGA) has non-highway wire segments for connection to logic blocks, and highway wire segments in a highway network of highways. Each highway has sets of highway wire segments in successive connection. Each successive connection is through a multiplexer. Multiplexers of highways have on-ramps, off-ramps, or both, for programmable connection to wire segments in accordance with programming the FPGA.

16 Claims, 5 Drawing Sheets

FAST FPGA INTERCONNECT STITCHING FOR WIRE HIGHWAYS

CROSS-REFERENCE TO RELATED APPLICATIONS

This application claims benefit of priority from U.S. Provisional Application No. 63/144,882 titled FAST FPGA INTERCONNECT STITCHING FOR WIRE HIGHWAYS and filed Feb. 2, 2021, which is hereby incorporated by reference.

TECHNICAL FIELD

The technical field of the present disclosure relates to field programmable gate arrays (FPGAs), and more specifically to wiring and programmable interconnect in FPGAs.

BACKGROUND

Modern field programmable gate arrays (FPGAs) contain a variety of wires that can be connected together with static random access memory (SRAM) programmable multiplexers, also called multiplexors or muxes. Multiplexers, generally, select from among multiplexer inputs, and drive one or more multiplexer outputs. A standard feature of FPGAs is that various connections of these wires are programmable in accordance with FPGA programming, for example through an FPGA programmer (e.g., a type of CAD or computer aided design system) according to a design that is represented in a design database. These wires typically vary in length from spanning a single logic block to spanning a significant portion of the chip. Short wires are used to make local connections and long wires are used to make faster connections that span a long distance. The long wires typically use less resistive metal layers to make them faster, and are also often buffered to avoid delay increasing quadratically with length (e.g., according to wire capacitance and resistance each increasing linearly with length causing RC time delay to increase quadratically).

An FPGA architect must make trade-offs when deciding on the mix of wire segment lengths in an FPGA. Shorter wires are more flexible as it is easier to combine them to reach an arbitrary logic block on the chip. Longer wires offer the potential of a faster path over a longer distance, but they are expensive and are more difficult for CAD tools to use efficiently.

BRIEF SUMMARY

Described herein are embodiments of field programmable gate arrays (FPGAs), highways, highway networks, off-ramps and on-ramps of highways, structures, functionality and further aspects of multiplexers used to connect highway wire segments and non-highway wire segments, programmable connections, FPGA programming, computer aided design (CAD) systems, CAD tools, and various apparatuses and related methods.

One embodiment is a field programmable gate array. The FPGA includes wire segments. Wire segments include non-highway wire segments and highway wire segments. The non-highway wire segments are for connection to logic blocks. The highway wire segments are in a highway network of highways. Each highway includes multiple sets of highway wire segments in successive connection. Each successive connection is through a multiplexer. At least one multiplexer of each highway includes an on-ramp. The on-ramp is for connection to and selection of a further wire segment to drive onto a highway wire segment of the highway in accordance with programming the FPGA. At least one multiplexer of each highway includes an off-ramp. The off-ramp is for connection of a highway wire segment to a non-highway wire segment in accordance with programming the FPGA.

One embodiment is a method of operating a field programmable gate array. The method includes programming an FPGA that has wire segments including non-highway wire segments and highway wire segments, to define a first functionality of the FPGA. Non-highway wire segments are for connection to logic blocks. Highway wire segments are in a highway network of highways. Each highway includes multiple sets of highway wire segments in successive connection. Each successive connection is through a multiplexer. The method includes programming an on-ramp of at least one multiplexer of the highway for connection to and selection of a further wire segment to drive onto a highway wire segment of the highway, to define a second functionality of the FPGA. The method includes programming an off-ramp of at least one multiplexer of a highway for connection of a highway wire segment to a non-highway wire segment, to define a third functionality of the FPGA.

One embodiment is a tangible, non-transitory, computer-readable media that has instructions on the media. The instructions, when executed by a processor, cause the processor to program an FPGA to define a first functionality of the FPGA. The FPGA has multiple wire segments including non-highway wire segments and highway wire segments. The non-highway wire segments are for connection to logic blocks. The highway wire segments are in a highway network of highways. Each highway includes multiple sets of highway wire segments in successive connection. Each successive connection is through a multiplexer. The instructions cause the processor to program an on-ramp of at least one multiplexer of a highway for connection to and selection of a further wire segment to drive onto a highway wire segment of the highway, to define a second functionality of the FPGA. The instructions cause the processor to program an off-ramp at least one multiplexer of a highway for connection of a highway wire segment to a non-highway wire segment, to define a third functionality of the FPGA.

BRIEF DESCRIPTION OF DRAWINGS

Embodiments described herein will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
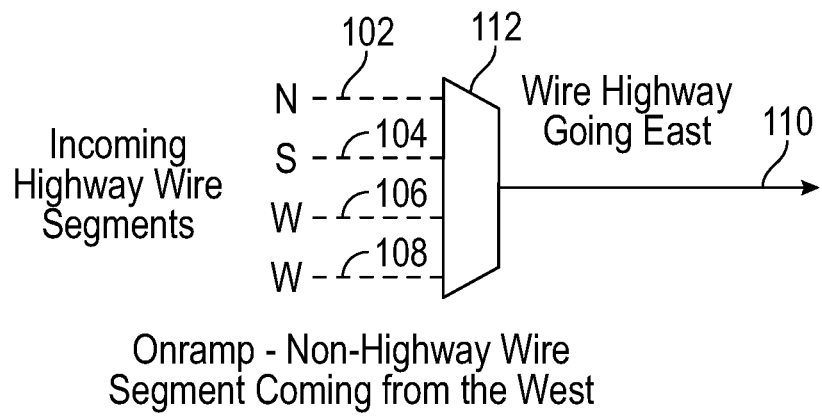
FIG. 1 shows the on-ramp onto the wire segment highway, in an embodiment.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

The techniques disclosed herein create a network of wire segments that are stitched together with limited flexibility but with very low delay. This network of wire segments is termed a "highway", and may also be called a wire highway or wire segment highway. Multiple such highways are termed a highway network or highway wire network. There are different types of wire segments. Highway wire segments are used for highways, non-highway wire segments are used outside of highways. In one embodiment, the highway wire network is stitched together so efficiently that there is no need for long wires—stitching together shorter wires is almost as fast, and far more flexible. Techniques for stitching together fast short wires on FPGAs in order to replace the use of a traditional long wire network are disclosed.

In one embodiment, wire segments that are part of the highway network only connect to other wire segments of the same network (e.g., highway wire segments connecting to other highway wire segments through multiplexers along a highway) and also have each wire segment have a very limited number of on-ramps and off-ramps that allow access to and from the highway network, i.e., onto and off of highways of the highway network, respectively. That is, on-ramps allow signals to go onto the highway network, e.g., from off-highway circuitry, and off-ramps allow signals to come off the highway network, e.g., to off-highway circuitry.

In one embodiment, an example highway network is implemented with each wire segment driven by a 4:1 mux implemented as a "flat" mux, which can in practice have delay very similar to a simple buffer. In one embodiment, a 4:1 mux driving an east-going highway wire segment is driven by wire segments of the same type coming from the west, north, and south. Additionally, the 4:1 mux is driven by a single wire coming from the west from one additional wire of a different type. This extra wire connection is called the "on-ramp", and is programmable in accordance with FPGA programming of various connections. It should be appreciated that these compass directions are for relative description in this context and not to be confused with absolute orientation relative to geomagnetic directions on Earth or elsewhere.

In one embodiment, each wire segment in the highway network connects to three other wire segments from the highway network as well as one off-ramp, and does not connect to any logic blocks directly. This extra wire connection is called the "off-ramp", and is programmable in accordance with FPGA programming of various connections. Having a limited number of off-ramps reduces loading on the wire and helps make it faster.

The overall effect is that there is limited flexibility to get on or off the highway network. Once on the highway network, the connections are very fast and it is possible to get quite close to the destination logic block while staying on the fast network. In contrast, the typical long wire network on an FPGA is not as flexible.

FIG. 1 illustrates one embodiment of connections and how the connections to each highway wire segment are minimized. Referring to FIG. 1, the 4:1 mux driving each highway wire segment is only driven by three highway wire segments plus one on-ramp from a different wire segment network. In the embodiment shown, wire highway 110 is going east, and incoming highway wire segments include a highway wire segment 102 from north, a highway wire segment 104 from south, and a highway wire segment 106 from west. The non-highway wire segment 108 that is connected through the programmable connection of the on-ramp is from west.

In FIG. 1, a multiplexer 112 is shown driving all of the highway wire segments of the wire highway 110, and could be composed of multiple multiplexers each driving one of the highway wire segments. Other inputs to the other multiplexers are not shown, but are readily devised. Generally, the on-ramp includes a programmable connection to an input of a multiplexer. Various embodiments of on-ramp further include supporting electrical or electronic circuitry or components specific to a design in an appropriate technology, as readily devised, for example portions of an implementation of a multiplexer in an FPGA, and various geometries in various layers of an integrated circuit. The multiplexer selects from among multiplexer inputs to drive highway wire segment(s) as outputs of the multiplexer, in various embodiments. Specifically, in the embodiment shown in FIG. 1, the multiplexer 112 in a wire highway (e.g., going east) selects from among three highway wire segments 102, 104, 106 and the programmable connection of the on-ramp that connects (e.g., in accordance with FPGA programming) to the non-highway wire segment 108, all as inputs to the multiplexer 112, to drive one (or more, in a variation) of the highway wire segments in the wire highway 110 as output of the multiplexer 112.

Figure 2:
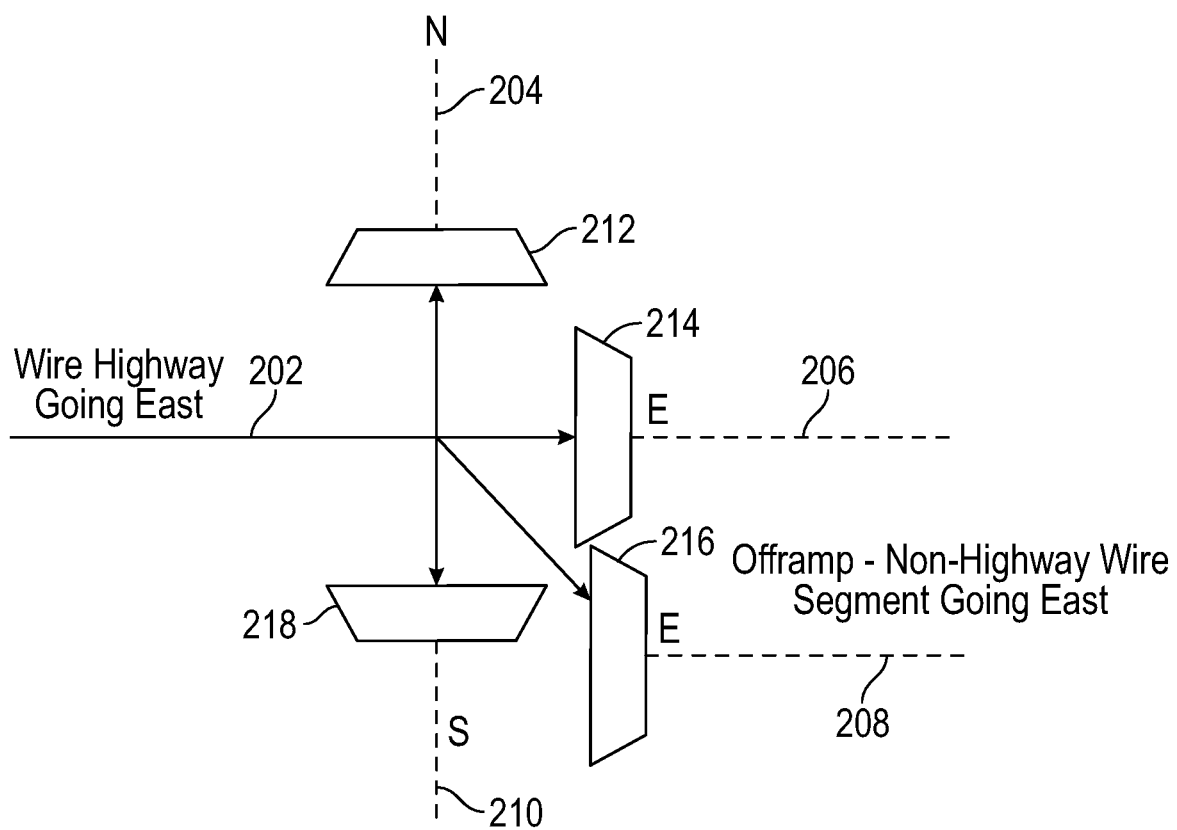
FIG. 2 shows the off-ramp from the wire segment highway, in an embodiment.

FIG. 2 illustrates an example of loading on a highway wire segment and how each highway wire segment is minimized. Referring to FIG. 2, each highway wire segment only connects to three other highway wire segments as well as to one off-ramp, which is connected to a different wire segment network. In the embodiment shown, wire highway 202 is going east, and connects to a multiplexer 212 that drives a highway wire segment 204 going north, a multiplexer 214 that drives a highway wire segment 206 going east, a multiplexer 218 that drives a highway wire segment 210 going south, and a multiplexer 216 that programmably connects (e.g., the connection is programmed in accordance with FPGA programming) via an off-ramp to a non-highway wire segment 208 going east, and drives that non-highway wire segment 208. In various embodiments, the programmable connection that is part of the off-ramp could be implemented as a programmable connection of a highway wire to a non-highway wire, a programmable connection of a highway wire to the multiplexer 216 (or to other wire or active circuit component in variations), a hardwired connection of the highway wire to a hard structure multiplexer 216 with programmable output connection of the multiplexer 216 to the non-highway wire segment 208 or other wire segment(s) in variations, or other programmable connection according to FPGA programming.

In FIG. 2, each of the multiplexers 212, 214, 216, 218 is shown driving a single wire segment, e.g. wire segments 204, 206, 208, 210, but could be composed of multiple multiplexers each available to drive one of various highway wire segments or one of various non-highway wire segments, through hard-wired or programmable connection in various embodiments. Other outputs of such other multiplexers are not shown, but are readily devised. Generally, the off-ramp includes a programmable connection to another component that is not part of the highway to which that off-ramp belongs, and which is available for such programmable connection. In various embodiments the component available for programmable connection of an off-ramp of a multiplexer is a non-highway wire segment that could in turn be programmably connected to further circuitry according to FPGA programming. See also FIGS. 4A-5E for further embodiments, including programmable connection to highway wires and non-highway wires. Various embodiments of off-ramp further include supporting electrical or electronic circuitry or components specific to a design in an appropriate technology, as readily devised, for example portions or all of an implementation of a multiplexer (e.g., multiplexer 216) in an FPGA, and various geometries in various layers of an integrated circuit. In various embodiments, the multiplexer selects from among multiplexer inputs including various highway wire segments of the wire highway to drive a multiplexer output with programmable connection to a non-highway wire segment. Specifically, in the embodiment shown in FIG. 2, the multiplexer 216 for an off-ramp of a wire highway 202 (e.g., going east) selects from among highway wire segments of the wire highway 202, as inputs to the multiplexer 216, to drive one (or more, in a variation) non-highway wire 208 (e.g., going east) as output of the multiplexer 216.

Figure 3:
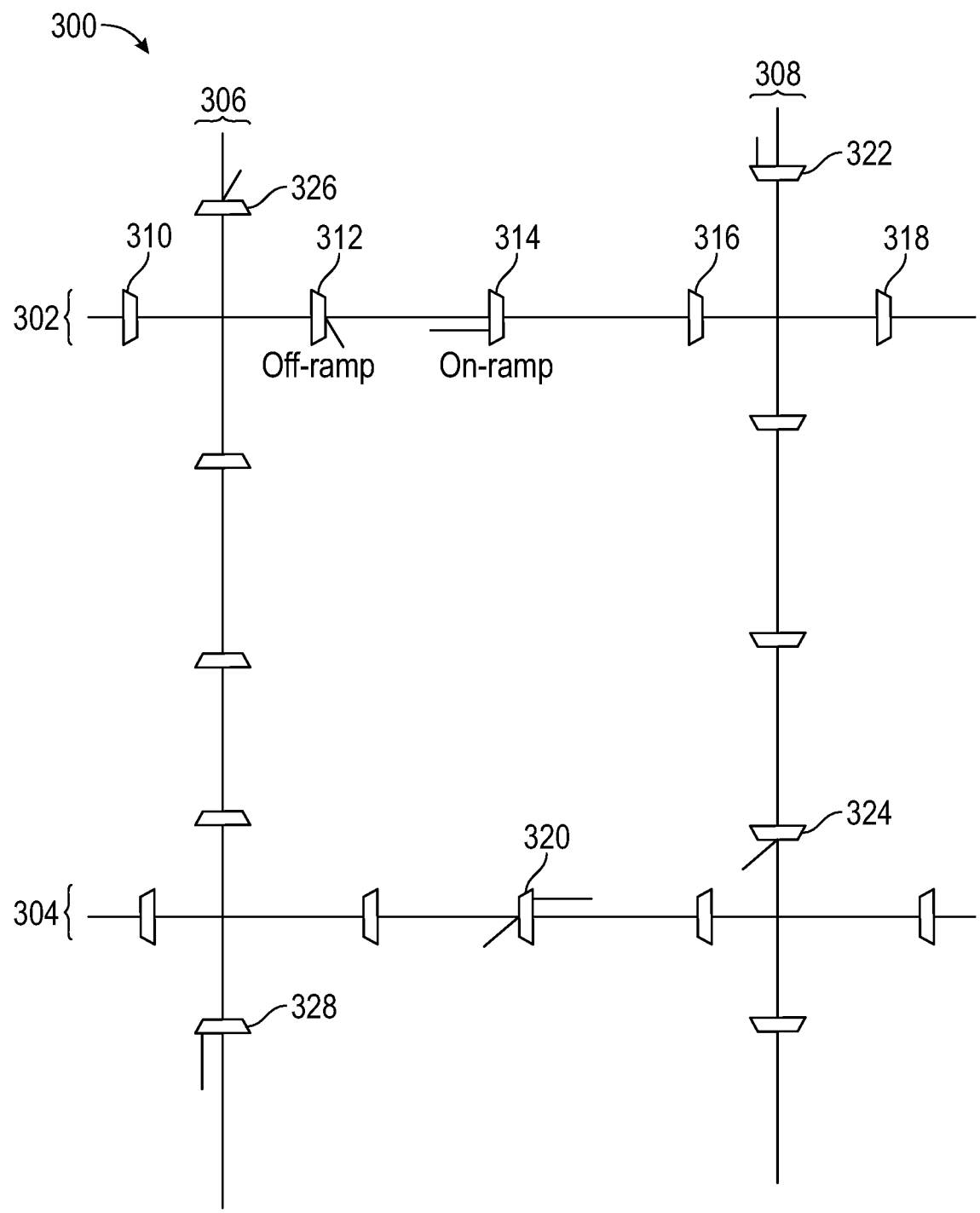
FIG. 3 shows a highway network, with example on-ramps and off-ramps, in an embodiment.

FIG. 3 shows a highway network 300, with example on-ramps and off-ramps, in an embodiment. There are multiple highways, oriented in various directions, for example south to north highway 306, north to south highway 308, west to east highway 302, and east to west highway 304. Each wire segment highway or wire highway 302, 304, 306, 308 has highway wire segments and multiplexers, e.g., multiplexer 310, 312, 314, 316, 318, 320 and see also FIGS. 1 and 2. In each highway, sets of highway wire segments are in successive connection, with each successive connection through a multiplexer. That is, a highway is made of multiple sets of highway wire segments, and multiplexers, with a given set of highway wire segments connected to the next set of highway wire segments through a multiplexer, and this structure repeating along the highway for successive sets of highway wire segments. Highways, and more specifically highway wire segments of highways, can connect to logic blocks (not shown, but commonly known and understood) through off-ramps and on-ramps (see FIGS. 1, 2 and 5B-5E). There can be more highways, fewer highways, split highways going in two directions (e.g., see FIG. 2 showing a highway wire segment 204 going north and a highway wire segment 210 going south), highway intersections with interconnection among highways (see FIGS. 1, 2, 4A, 4B, 5A and variations thereof), highway crossings with no interconnection (analogous to overpasses or underpasses), other orientations of highways (e.g., diagonals, other angles, zigzags or stair steps may be possible), a ring highway, a star configuration, etc., in variations of the highway network 300. Some of the multiplexers 312, 320, 324, 326 have an off-ramp, some of the multiplexers 314, 320, 322, 328 have on-ramps, some of the multiplexers 320 have both an on-ramp and an off-ramp, and these are programmable (i.e., have programmable connections) in accordance with FPGA programming, with variations readily devised. For example, in one embodiment all multiplexers of all highways of a highway network are capable of individually programmable connection for an on-ramp and an off-ramp according to FPGA programming, and in other embodiments, some specified ones (i.e., a subset) of the multiplexers of an FPGA have such capability for an on-ramp, an off-ramp, or both. Various embodiments have design trade-offs in versatility and connection (hard and programmable) of multiplexers versus loading on a given highway and resultant signal propagation speeds and delays.

Figure 4A:
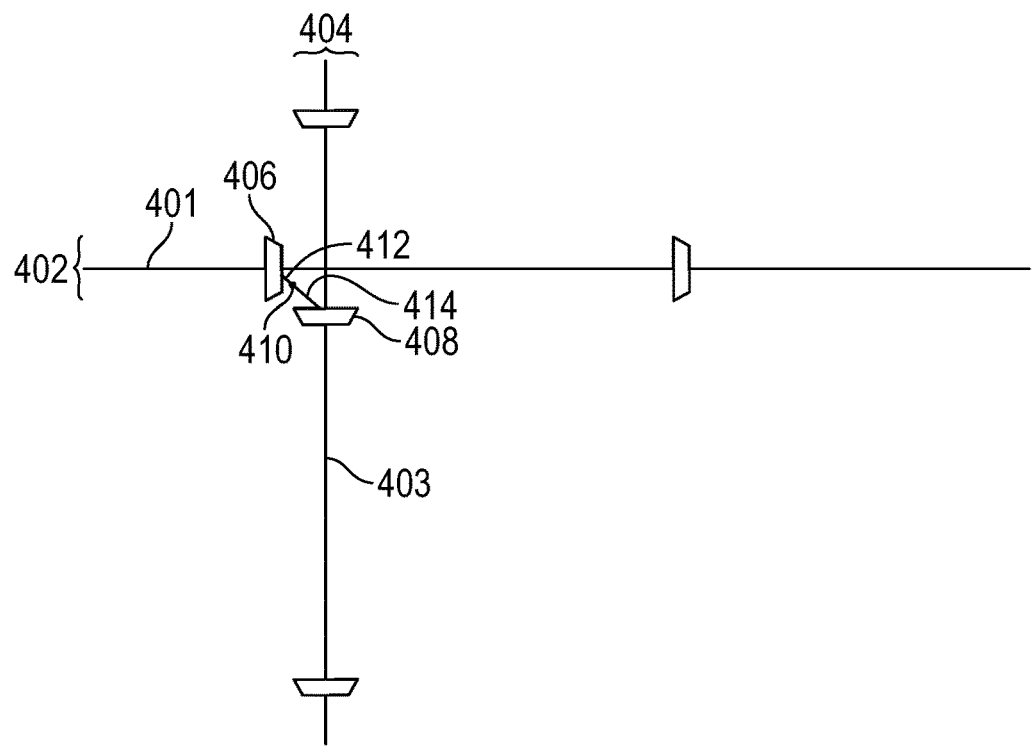
FIG. 4A shows a first type of programmable connection from a highway wire segment of one wire segment highway to a highway wire segment of another wire segment highway.

FIG. 4A shows a first type of programmable connection from a highway wire segment 401 of one wire segment highway 402 to a highway wire segment 403 of another wire segment highway 404. A multiplexer 406 belonging to the wire segment highway 402 has an off-ramp with programmable connection of an output 412 of the multiplexer 406. A multiplexer 408 of the wire segment highway 404 has an on-ramp with programmable connection of an input 414 of the multiplexer 408. FPGA programming programs these two programmable connections, as programmable connection 410 to connect to each other, so that this first type of programmable connection 410 connects the off-ramp of the multiplexer 406 of one highway 402 directly to the on-ramp of the multiplexer 408 of the other highway 404. Various orientations are possible in various embodiments, for connecting highway wire segments of various highways in various relative orientations.

Figure 4B:
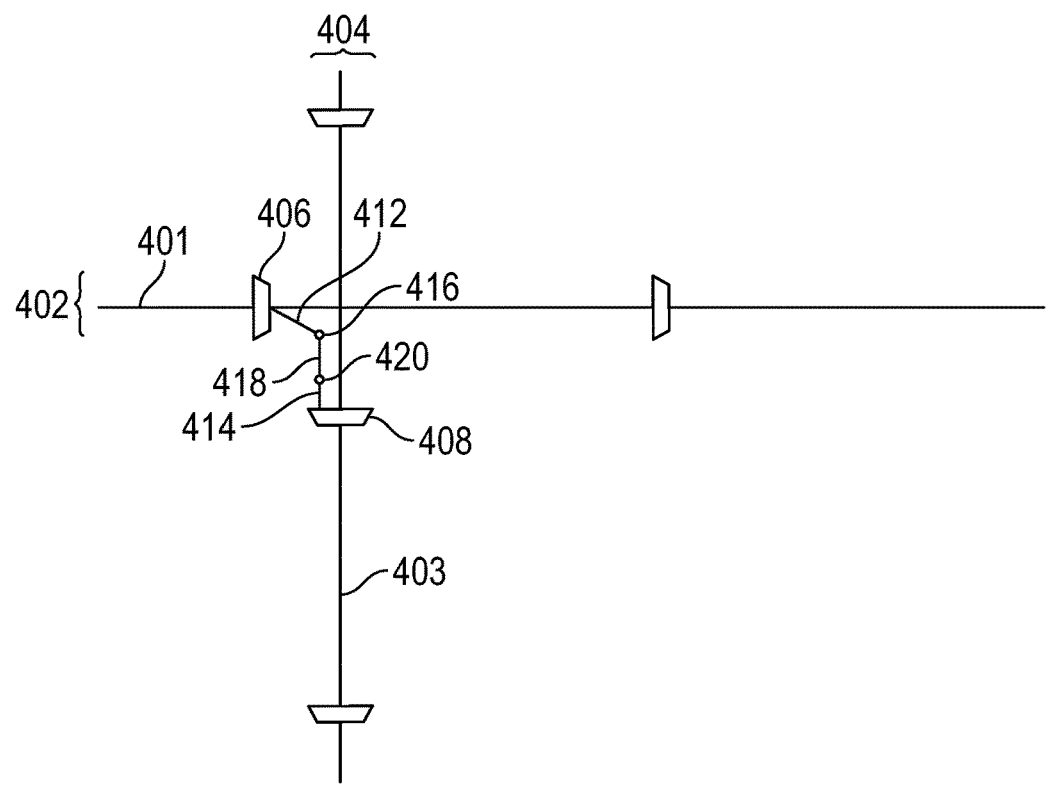
FIG. 4B shows a second type of programmable connection from a highway wire segment of one wire segment highway to a highway wire segment of another wire segment highway.

FIG. 4B shows a second type of programmable connection from a highway wire segment 401 of one wire segment highway 402 to a highway wire segment 403 of another wire segment highway 404. A multiplexer 406 belonging to the wire segment highway 402 has an off-ramp with programmable connection 416 of an output 412 of the multiplexer 406. A multiplexer 408 of the wire segment highway 404 has an on-ramp with programmable connection 420 of an input 414 of the multiplexer 408. A non-highway wire segment 418 is available for programmable connection. FPGA programming programs these two programmable connections 416, 420 to connect to the non-highway wire segment 418 and thus through the non-highway wire segment 418 to each other, so that this second type of programmable connection connects the off-ramp of the multiplexer 406 of one highway 402 through the non-highway wire segment 418 to the on-ramp of the multiplexer 408 of the other highway 404. Various orientations are possible in various embodiments, for connecting highway wire segments of various highways in various relative orientations. With reference to FIGS. 4A and 4B, these embodiments and variations thereof are applicable to FIGS. 1-3 and variations thereof.

Figure 5A:
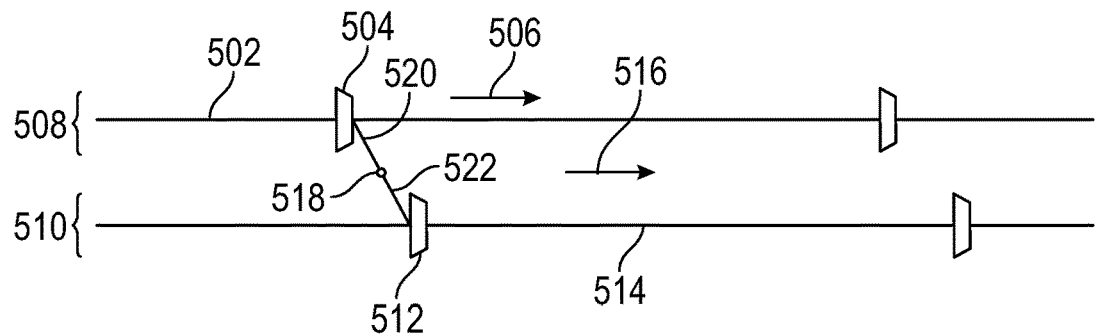
FIG. 5A shows a first type of programmable off-ramp connection.

FIG. 5A shows a first type of programmable off-ramp connection 518. This programmable connection 518 is for connection of one highway wire segment 502 of a highway 508 going in one direction 506 to another highway wire segment 514 of another highway 510 going in the same direction 516 (i.e., parallel or straightahead, in contrast to perpendicular or reverse direction connections). In one embodiment, the programmable connection 518 connects an output 520 of a multiplexer 504 of a highway 508 to an input 522 of a multiplexer 512 of another highway 510. Thus, the programmable connection 518 connects the highway wire segment 502 to the highway wire segment 514 through an off-ramp of the multiplexer 504, which has the highway wire segment 502 as an input to the multiplexer 504, and the on-ramp of the multiplexer 512, which drives the highway wire segment 514 as an output of the multiplexer 512.

Figure 5B:
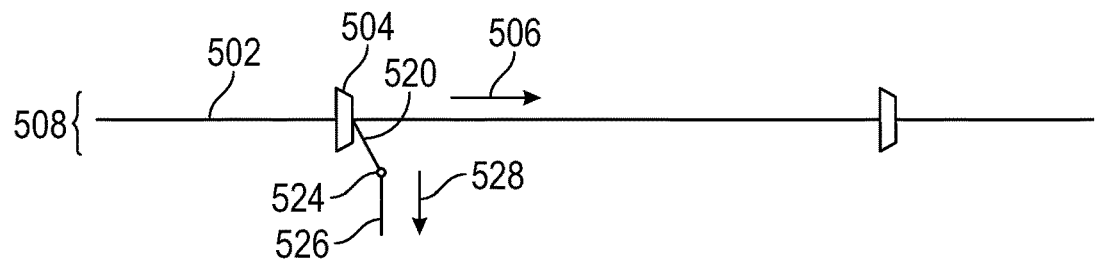
FIG. 5B shows a second type of programmable off-ramp connection.

FIG. 5B shows a second type of programmable off-ramp connection 524. This programmable connection 524 is for right angle connection of one highway wire segment 502 of a highway 508 going in one direction 506 to a non-highway wire segment 526 going in a direction 528 that is perpendicular to the direction 506 of the highway 508. In one embodiment, the programmable connection 524 connects an output 520 of a multiplexer 504 of a highway 508 to a non-highway wire segment 526 that is available for such connection. Thus, the programmable connection 524 connects the highway wire segment 502 to the non-highway wire segment 526 through an off-ramp of the multiplexer 504, which drives the non-highway wire segment 526 as an output of the multiplexer 504.

Figure 5C:
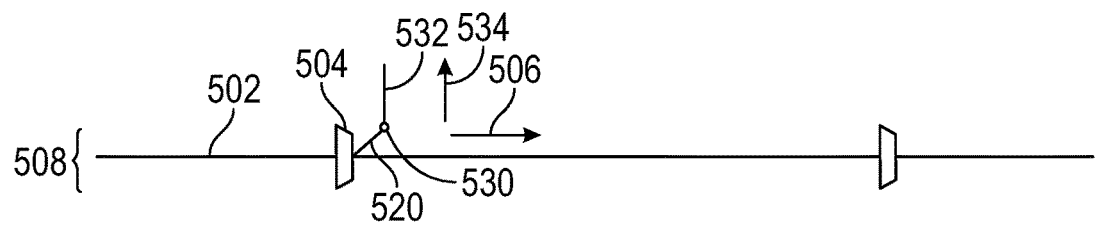
FIG. 5C shows a third type of programmable off-ramp connection.

FIG. 5C shows a third type of programmable off-ramp connection 530. This programmable connection 530 is for a right-angle connection of one highway wire segment 502 of a highway 508 going in one direction 506 to a non-highway wire segment 532 going in a direction 534 that is perpendicular to the direction 506 of the highway 508 and in the opposite direction of the direction 528 applicable to FIG. 5B. In one embodiment, the programmable connection 530 connects an output 520 of a multiplexer 504 of a highway 508 to a non-highway wire segment 532 that is available for such connection. Thus, the programmable connection 530 connects the highway wire segment 502 to the non-highway wire segment 532 through an off-ramp of the multiplexer 504, which drives the non-highway wire segment 532 as an output of the multiplexer 504.

Figure 5D:
FIG. 5D shows a fourth type of programmable off-ramp connection.

FIG. 5D shows a fourth type of programmable off-ramp connection 536. This programmable connection 536 is for a connection of one highway wire segment 502 of a highway 508 going in one direction 506 to a non-highway wire segment 538 going in a direction 540 that is the same direction as the direction 506 of the highway 508 (i.e., parallel). In one embodiment, the programmable connection 536 connects an output 520 of a multiplexer 504 of a highway 508 to a non-highway wire segment 538 that is available for such connection. Thus, the programmable connection 536 connects the highway wire segment 502 to the non-highway wire segment 538 through an off-ramp of the multiplexer 504, which drives the non-highway wire segment 538 as an output of the multiplexer 504.

Figure 5E:
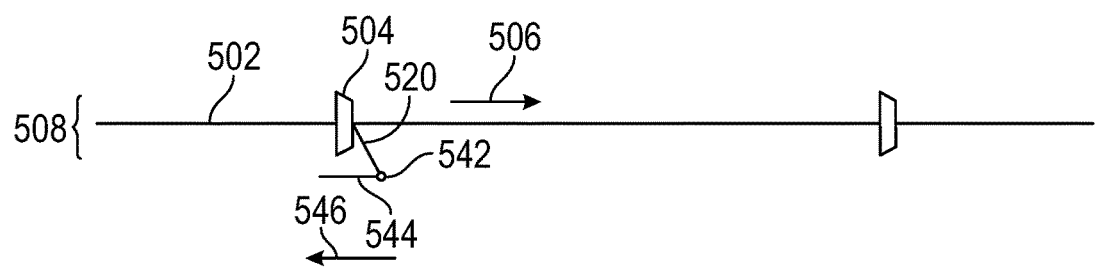
FIG. 5E shows a fifth type of programmable off-ramp connection.

FIG. 5E shows a fifth type of programmable off-ramp connection 542. This programmable connection 542 is for a reverse direction of one highway wire segment 502 of a highway 508 going in one direction 506 to a non-highway wire segment 544 going in the opposite direction 546. In one embodiment, the programmable connection 542 connects an output 520 of a multiplexer 504 of a highway 508 to a non-highway wire segment 544 that is available for such connection. Thus, the programmable connection 530 connects the highway wire segment 502 to the non-highway wire segment 544 through an off-ramp of the multiplexer 504, which drives the non-highway wire segment 544 as an output of the multiplexer 504.

With reference to FIGS. 5A-5E, these embodiments and variations thereof are applicable to FIGS. 1-3 and variations thereof.

Figure 6:
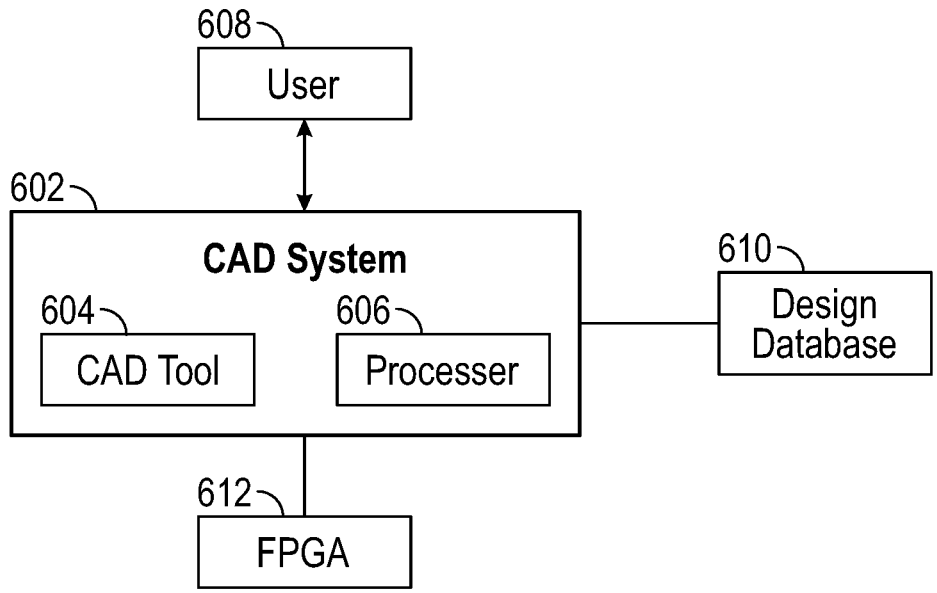
FIG. 6 shows a CAD system programming an FPGA using a design database.

FIG. 6 shows a CAD system 602 programming an FPGA 612, using a design database 610. In various embodiments, the FPGA 612 has various features described above with reference to FIGS. 1-5E, including programmable connectivity of other FPGAs for defining functionality of a programmed FPGA (e.g., programmable logic, programmable circuitry, I/O) plus programmable connectivity of the above-described highways for further defining functionality of the programmed FPGA. In an operating scenario, a user 608 provides or develops a design database 610 representing a design to be implemented in the programmed FPGA 612. Development of a design database 610 can be done using a CAD tool 604 on the CAD system 602, or elsewhere with the design database 610 imported to the CAD system 602. With an unprogrammed FPGA 612 coupled to the CAD system 602, for example by inserting an FPGA into a programming socket, the CAD system 602 proceeds to program the FPGA 612 according to the design database 610. This installs the defined functionality into the FPGA 612, which is then ready for operation, e.g., in test verification by the CAD system 602, in a test fixture on a tester, or installed in a manufactured product. Operation of the FPGA 612 includes the FPGA 612 driving signals onto, in and off of the highway network and in circuits that are all programmed (e.g., all programmable connections defined) according to the FPGA programming and designed functionality of the programmed FPGA 612.

Figure 7:
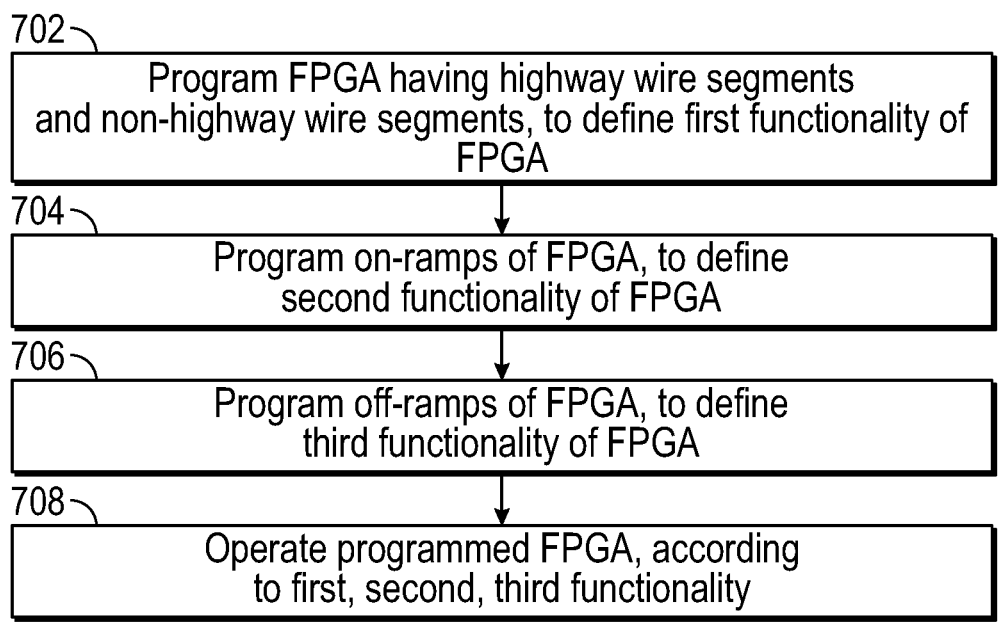
FIG. 7 is a flow diagram of a method of operating an FPGA, which can be practiced using various embodiments of highways, highway networks, on-ramps, off-ramps and programmable connectivity as described herein.

FIG. 7 is a flow diagram of a method of operating an FPGA, which can be practiced using various embodiments of highways, highway networks, on-ramps, off-ramps and programmable connectivity as described herein. The method can be embodied in instructions in tangible, non-transient, computer-readable media, for execution by a processor.

In an action 702, a processor programs an FPGA that has highway wire segments and non-highway wire segments, to define first functionality of the FPGA. Such functionality could be captured in a design database representing a circuit or system design to be implemented in the programmed FPGA.

In an action 704, the processor programs the on-ramps of the FPGA, to define second functionality of the FPGA. Such functionality and programming includes connections for the on-ramps.

In an action 706, the processor programs the off-ramps of the FPGA, to define third functionality of the FPGA. Such functionality and programming includes connections for the off-ramps.

In an action 708, the FPGA is operated, according to the first, second and third functionality. Operation of the FPGA could include verification, testing, or full-function operation of the programmed FPGA in a system. It should be appreciated that the actions 702, 704, 706 could be performed in various orders or combined, and that the total functionality of the programmed FPGA is understood as a combination of the first, second and third functionality, each of which covers a portion of the total functionality.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMS), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A field programmable gate array (FPGA), comprising:
a plurality of wire segments comprising non-highway wire segments for connection to logic blocks and highway wire segments in a highway network of highways;
each highway comprising a plurality of sets of highway wire segments in successive connection, each successive connection through a multiplexer;
at least one multiplexer of each highway including an on-ramp for connection to and selection of a further wire segment to drive onto a highway wire segment of the highway in accordance with programming the FPGA; and
at least one multiplexer of each highway including an off-ramp for connection of a highway wire segment to a non-highway wire segment in accordance with programming the FPGA,
wherein the plurality of off-ramps has programmable connectivity comprising a first type of off-ramp connection for connection to another highway wire segment of another highway in a first direction, a second type of off-ramp connection for a first right angle connection to another wire segment in a second direction, a third type of off-ramp connection for a second right angle connection to another wire segment in a third direction opposed to the second direction, a fourth type of off-ramp connection for connection to a non-highway wire segment in the first direction, and a fifth type of off-ramp connection for reverse direction connection to a non-highway wire in a fifth direction opposed to the first direction.

2. The FPGA of claim 1, wherein:
each off-ramp comprises a multiplexer of the highway having the highway wire segment as input and having a programmable connection of an output of the multiplexer.

3. The FPGA of claim 1, wherein:
at least one multiplexer of each highway has connectability to a highway wire segment of another highway and connectability to a non-highway wire segment, through programmable connection of an input of the multiplexer as the on-ramp.

4. The FPGA of claim 1, wherein:
a highway wire of a first highway has programmable connectivity to a highway wire of a second highway through programmable connection of an off-ramp of the first highway to an on-ramp of the second highway.

5. The FPGA of claim 1, wherein:
a highway wire of a first highway has programmable connectivity to a highway wire of a second highway through programmable connection of an off-ramp of the first highway, a non-highway wire, and an on-ramp of the second highway.

6. A method of operating a field programmable gate array (FPGA), comprising:
programming an FPGA having a plurality of wire segments comprising non-highway wire segments for connection to logic blocks and highway wire segments in a highway network of highways, each highway comprising a plurality of sets of highway wire segments in successive connection, each successive connection through a multiplexer, to define a first functionality of the FPGA;
programming an on-ramp of at least one multiplexer of a highway for connection to and selection of a further wire segment to drive onto a highway wire segment of the highway, to define a second functionality of the FPGA; and programming an off-ramp of at least one multiplexer of a highway for connection of a highway wire segment to a non-highway wire segment, to define a third functionality of the FPGA; and programming a plurality of off ramps comprising programming a first type of off-ramp connection for connection to another highway wire segment of another highway in a first direction, programming a second type of off-ramp connection for a first right angle connection to another wire segment in a second direction, programming a third type of off-ramp connection for a second right angle connection to another wire segment in a third direction opposed to the second direction, programming a fourth type of off-ramp connection for connection to a non-highway wire segment in the first direction, and programming a fifth type of off-ramp connection for reverse direction connection to a non-highway wire in a fifth direction opposed to the first direction.

7. The method of operating the FPGA of claim 6, wherein:
programming the off-ramp comprises programming an output connection of the multiplexer for the connection to the non-highway wire segment.

8. The method of operating the FPGA of claim 6, wherein:
programming the on-ramp comprises programming an input of the multiplexer for the connection to the further wire segment, which comprises a highway wire segment of another highway or a non-highway wire segment.

9. The method of operating the FPGA of claim 6, further comprising:
programming connection of a highway wire of a first highway to a highway wire of a second highway through an off-ramp of the first highway with a programmable connection to an on-ramp of the second highway.

10. The method of operating the FPGA of claim 6, further comprising:
programming connection of a highway wire of a first highway to a highway wire of a second highway through a programmable connection of an off-ramp of the first highway, a non-highway wire, and an on-ramp of the second highway.

11. The method of operating the FPGA of claim 6, further comprising:
driving signals through the highway wire segments of the programmed FPGA after all such programming.

12. A tangible, non-transitory, computer-readable media having instructions thereupon which, when executed by a processor, cause the processor to:
program an FPGA having a plurality of wire segments comprising non-highway wire segments for connection to logic blocks and highway wire segments in a highway network of highways, each highway comprising a plurality of sets of highway wire segments in successive connection, each successive connection through a multiplexer, to define a first functionality of the FPGA;

program an on-ramp of at least one multiplexer of a highway for connection to and selection of a further wire segment to drive onto a highway wire segment of the highway, to define a second functionality of the FPGA;

program an off-ramp of at least one multiplexer of a highway for connection of a highway wire segment to a non-highway wire segment, to define a third functionality of the FPGA; and program a plurality of off-ramps comprising programming a first type of off-ramp connection for connection to another highway wire segment of another highway in a first direction, programming a second type of off-ramp connection for a first right angle connection to another wire segment in a second direction, programming a third type of off-ramp connection for a second right angle connection to another wire segment in a third direction opposed to the second direction, programming a fourth type of off-ramp connection for connection to a non-highway wire segment in the first direction, and programming a fifth type of off-ramp connection for reverse direction connection to a non-highway wire in a fifth direction opposed to the first direction.

13. The computer-readable media of claim 12, wherein:
to program the off-ramp comprises programming an output connection of the multiplexer of the highways for the connection of the highway wire segment to the non-highway wire segment.

14. The computer-readable media of claim 12, wherein:
to program the on-ramp comprises programming an input of the multiplexer for connection to a highway wire segment of another highway or to a non-highway wire segment.

15. The computer-readable media of claim 12, wherein the instructions are further to cause the processor to:
program connection of a highway wire of a first highway to a highway wire of a second highway through an off-ramp of the first highway with a programmable connection to an on-ramp of the second highway.

16. The computer-readable media of claim 12, wherein the instructions are further to cause the processor to:
program connection of a highway wire of a first highway to a highway wire at a second highway through a programmable connection of an off-ramp of the first highway, a non-highway wire, and an on-ramp of the second highway.

* * * * *